(12) United States Patent
Cheng et al.

(10) Patent No.: US 10,056,426 B2
(45) Date of Patent: Aug. 21, 2018

(54) APPARATUS AND METHOD FOR FABRICATING A LIGHT GUIDING GRID

(71) Applicant: Taiwan Semiconductor Manufacturing Co., Ltd., Hsin-Chu (TW)

(72) Inventors: Yun-Wei Cheng, Taipei (TW); Volume Chien, Sinying (TW); I-I Cheng, Tainan (TW); Chi-Cherng Jeng, Madou Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/936,240

(22) Filed: Jul. 8, 2013

(65) Prior Publication Data

US 2015/0014802 A1 Jan. 15, 2015

(51) Int. Cl.
  *H01L 27/146* (2006.01)
  *G02B 3/00* (2006.01)

(52) U.S. Cl.
  CPC .... *H01L 27/14685* (2013.01); *H01L 27/1462* (2013.01); *H01L 27/14621* (2013.01); *H01L 27/14627* (2013.01); *G02B 3/0056* (2013.01)

(58) Field of Classification Search
  CPC .................................................. H01L 27/14627
  See application file for complete search history.

(56) References Cited

U.S. PATENT DOCUMENTS

| | | | |
|---|---|---|---|
| 7,553,689 B2 | 6/2009 | Lin et al. | |
| 7,955,764 B2* | 6/2011 | Liu | H01L 27/14623 430/319 |
| 2008/0049126 A1* | 2/2008 | Ford | H01L 27/14621 348/294 |
| 2011/0298074 A1* | 12/2011 | Funao | 257/432 |
| 2012/0273906 A1* | 11/2012 | Mackey et al. | 257/432 |
| 2014/0339615 A1* | 11/2014 | Wang | H01L 27/14621 257/294 |

OTHER PUBLICATIONS

Alakarhu, J., "Image Sensors and Image Quality in Mobile Phones", retrieved from: http://www.imagesensors.org/Past%20Workshops/2007%20Workshop/2007%20Papers/001%20Alakarhu.pdf, 4 pages.

Lee, K. et al., "SNR Performance Comparison of 1.4um Pixel: FSI, Light-guide, and BSI", R3, Dig. Tech. Papers, Feb. 2010, pp. 410-412.

* cited by examiner

*Primary Examiner* — Thao X Le
*Assistant Examiner* — Xia Cross
(74) *Attorney, Agent, or Firm* — Duane Morris LLP (57) ABSTRACT

A light guide grid can include a grid structure having a plurality of intersecting grid lines, each grid line having a width w, and a plurality of openings for photosensor elements between intersecting grid lines. The grid structure has a diagonal grid width between two adjacent ones of the plurality of openings in a diagonal direction. The diagonal grid width has a value exceeding approximately $\sqrt{3}$ w. An image sensor can include a light guide grid having a grid structure as described above and further include a micro-lens such as a sinking micro-lens and a color filter. A method of fabricating a light guide grid can include forming a grid above at least one photo sensor, the grid having intersecting grid lines of width w and a diagonal grid width in a diagonal direction having a value exceeding approximately $\sqrt{3}$ w.

20 Claims, 5 Drawing Sheets

APPARATUS AND METHOD FOR FABRICATING A LIGHT GUIDING GRID

TECHNICAL FIELD

The disclosure is related to a method and apparatus for fabricating light guiding grids for light sensitive structures such as image sensors.

BACKGROUND

An image sensor is a kind of semiconductor device that transforms optical images into electrical signals. Image sensors can be generally classified into charge coupled devices (CCDs) and complementary metal oxide semiconductor (CMOS) image sensors. Among these image sensors, a CMOS image sensor comprises a photodiode for detecting incident light and transforming it into electrical signals, and logic circuits for transmitting and processing the electrical signals. A CMOS image sensor includes a light sensing part having a plurality of photodiodes for accepting incident light, and for generating and accumulating electric charges, a protecting layer formed on a structure of the light sensing part, a color filter array, and a plurality of micro-lenses. The color filter array can be formed in a primary color system, i.e., comprising red filters (R), green filters (G), and blue filters (B), using photoresist materials containing a red, green, or blue pigment, respectively. Formation of each color filter involves a series of coating, exposure and development processes according to photolithography techniques. Alternatively, the color filter array can be formed in a complementary color system comprising cyan, yellow, and magenta filters.

BRIEF DESCRIPTION OF THE DRAWINGS

The drawings show certain exemplary embodiments intended to illustrate aspects of the disclosed subject matter. The subject developments are not limited to the embodiments illustrated as examples. In the drawings.

DETAILED DESCRIPTION

This disclosure describes a grid structure which is suitable for use in a color image sensor including a type of microlens referred to herein as a "sinking microlens."

With the demand for better performance, a micro-lens used for an image sensor can be thinned down to reduce the total distance that light travels from the outside of the microlens to a photo sensor beneath the microlens. A sinking micro-lens structure is a micro-lens having a peripheral portion extending down below a top of the color filter layer.

Figure 1:
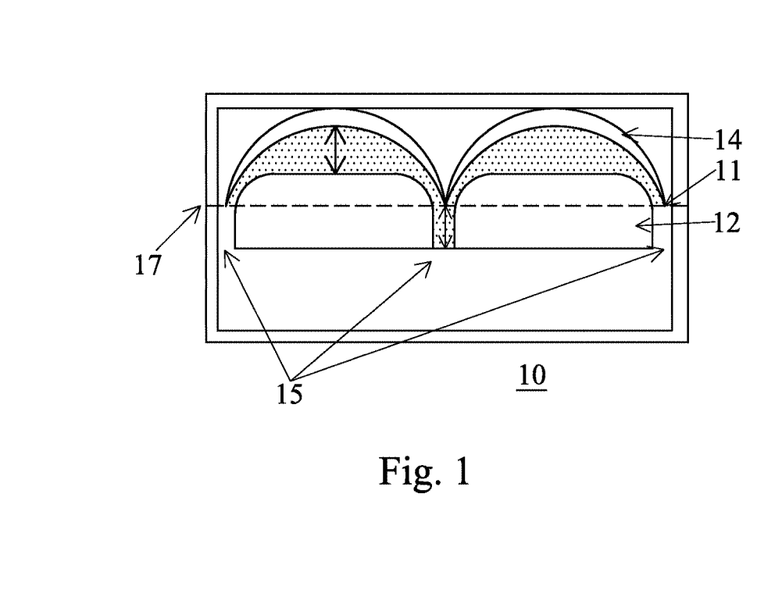
FIG. 1 is a diagram schematically representing a side cut view of a sinking micro-lens and a color filter as part of an image sensor.

FIG. 1 is a simplified illustration of a portion of an image sensor 10 having a sinking micro-lens 14 and a color filter 12. The dashed line 17 represents the bottom position of the micro-lens 14. In a sinking micro-lens, the micro-lens bottom 11 is positioned in a gap 15 between separated color filters 12, below the top surface of the color filter 12 as shown. The image sensor 10 includes the gap 15 between adjacent color filters, in which a grid structure (described below with reference to FIG. 3) can be formed.

The sinking micro-lens structure has an advantage of improvement in a parameter referred to as "SNR-10." Signal to noise ratio (SNR) at low illumination is an important performance factor for an image sensor. SNR-10 is the scene illumination for which SNR=10 after white balance and color correction. SNR-10 has been used as a good metric of SNR. However, the sinking micro lens design may allow incident light passing through a color filter near the gap between neighboring photo sensors to impinge on a neighboring photo sensor. This results in "color crosstalk."

Figure 3:
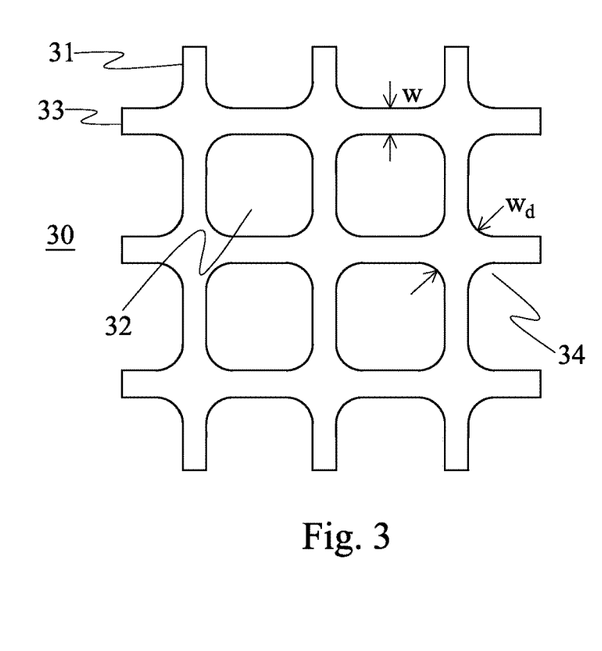
FIG. 3 is a top plan view of a light guiding grid in accordance with the embodiments.

Grid structures have openings corresponding to the locations of the color filters, to guide light into specific photosensor elements (underneath the color filter 12). The grid structure or light guiding grid 30 shown in FIG. 3 has a plurality of intersecting grid lines 31, 33 surrounding the openings. The grid lines prevent light passing through one microlens from striking a photo detector beneath an adjacent microlens. The grid structure 30 has a plurality of intersecting grid lines 31 and 33, each line having a primary grid width "w", to block the light from going in between two neighboring photosensor elements and prevent crosstalk. The primary grid width "w" is the width of the intersecting lines 31 and 33 of the grid 30 as shown in FIG. 3.

In order to prevent crosstalk (between adjacent photo sensing elements) from incoming light, the grid structure can be configured to properly block the light from traveling between a microlens and a photodiode beneath an adjacent microlens. Such design prevents incident light passing through any color filter from impinging on a photodetector beneath a neighboring color filter. In a configuration having a sinking microlens (extending down into the gap between color filters), the grid lines are formed in the region between color filters (i.e., the same region where micro-lens material extends down into a gap between color filters).

Figure 2A:
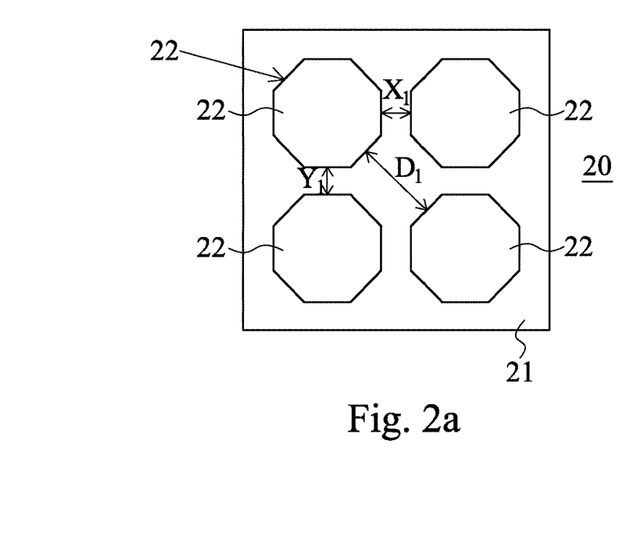
FIG. 2a is a top plan view of a color filter arrangement of an image sensor in accordance with the embodiments.
Figure 2B:
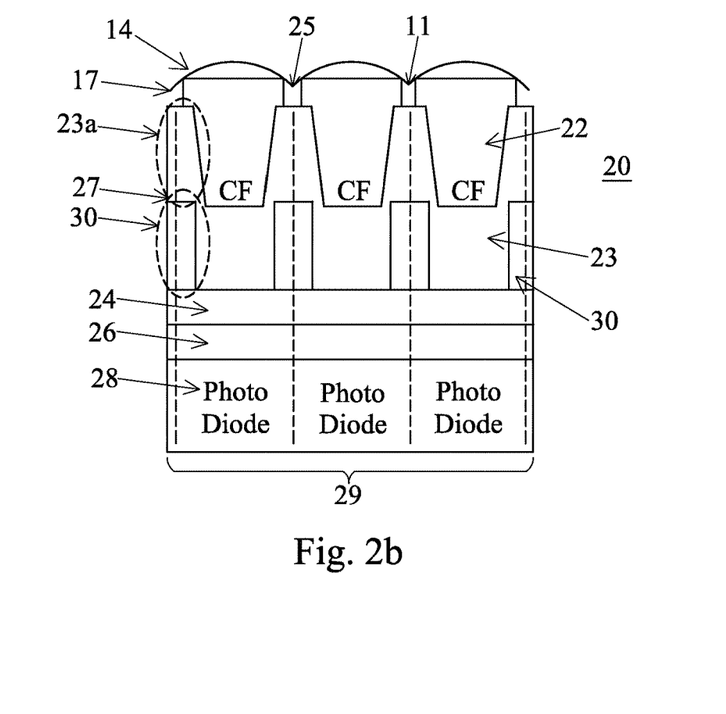
FIG. 2b is a side cut-view of the image sensor including sinking micro-lenses and a portion of a light guiding grid in accordance with the embodiments.

In some embodiments, as shown in the top plan view of FIG. 2a and in cross-sectional view FIG. 2b, the image sensor 20 has a color filter arrangement 21 with a sinking micro-lens 14. The sinking micro-lens 14 encroaches into a gap 25 between separated color filters, below the top surface of the color filters 22 as shown in FIG. 2b). The plurality of separated color filters 22 each has a polygonal shape with diagonal corners, such as an octagon. The diagonal width $w_d$ between diagonally adjacent octagons is greater than a diagonal space ($\sqrt{2}$ w) between color filters with square corners. Diagonals with square corners have radii that are equal to w, thus using the Pythagorean theorem, $w_d$ squared equals w squared plus w squared. Solving for $w_d$ makes the minimum distance for square corners $\sqrt{2}$ w. Any light which reaches one of the photo detectors without passing through the color filter 22 above that photo detector may cause noise and crosstalk. To provide an appropriate light guiding grid 30 for use with such a sinking micro-lens design, the intersection lines 31 and 33 have a width $w_d$ in a diagonal direction that is greater than $\sqrt{2}$ w, and the corners of the grid openings are rounded as shown in FIG. 3.

The primary grid width "w" of each intersecting line 31 and 33 of the grid 30 can be the same as in grid structures with square corners, but a minimum and a maximum diagonal grid width $w_d$ in the diagonal direction that provides the rounded corners can be calculated and implemented to reduce noise and crosstalk. The rounded edges or corners provide added thickness at the intersections between each of the intersecting members 31 and 33. Referring again to the light guiding grid 30 of FIG. 3, some embodiments include rounded corners 34 in the openings 32 of the grid structure to block light going through the bottom portion 11 of the micro-lens. Further, the diagonal grid width $w_d$ between two photo sensing elements in the diagonal direction should be between √3 w and 3 w where w is the width of grid structure. (see calculations below). In some embodiments, the diagonal grid width is greater than or equal to 2 w.

Referring again to the side cross sectional view of FIG. 2b, the image sensor can include a micro-lens 14 such as a sinking micro-lens. In FIG. 2b, the sinking microlenses 14 are shown above corresponding color filters 22. As in the image sensor 10 of FIG. 1, the image sensor 20 of FIG. 2b can include an area, position or gap 25 where a light guiding structure or grid 30 is formed. In some embodiments, the height of the grid 30 is lower than the top surface of the color filter at a level 27. Further note that the thickness of the grid 30 can range from 50 nm to 500 nm. The level 27 corresponds to a level at the top surface of the grid and below the top of the color filters. The level 27 is also below the micro lens bottom 11 of the sinking microlenses 14. In particular, the image sensor 20 can include a grid structure 30 including intersecting metal lines (lines 31 and 33 in FIG. 3), and having a dielectric 23 in the openings between the intersecting metal lines and above the metal lines. In some embodiments, the structure includes a dielectric grid 23a above the light guiding or metal grid 30. The dielectric 23 and the dielectric grid 23a are made of the same materials since the dielectric grid 23a is fabricated by etching away part of the dielectric 23. In some embodiments, the dielectric grid 23a by itself can be considered the "grid structure." In other embodiments, the combination of the dielectric grid 23a and the dielectric 23 can form the grid structure. In either case, the grid or grid structure serves to guide the incident light into the specific pixel or photo diode. In some embodiments, the dielectric grid 23a or the dielectric 23 is made of an opaque dielectric material that prevents or substantially hinders light from passing through such opaque dielectric material. The guiding of such incident light reduces crosstalk since light going through the color filter enters the wrong pixel. Thus, the embodiments herein define the diagonal width of the grid to further prevent crosstalk resulting from sinking micro-lenses. A sinking micro-lens reduces the total thickness of a packaged device, but the micro-lens will be separated to cause more crosstalk.

The image sensor 20 of FIG. 2b is formed with a number of sensor elements or photo diode elements 28 formed on the surface of the semiconductor substrate (e.g., a silicon substrate). The plurality of photo diode elements 28 can form a photo diode element array 29, where four such photo diode elements (e.g., two green elements, one blue element and one red element) can form a pixel in some embodiments. In other embodiments, a single photo diode element forms a pixel. An anti-reflective coating (ARC) layer 26 is formed above the photo diode elements 28 and the substrate. The inclusion of the ARC layer 26 over the light sensing elements such as photo diode elements 28 reduces the loss of incident light due to reflection. In general, it has been found that the ARC layer 26 should be transparent to light in the visible spectrum. A buffer layer 24 may be formed on the ARC layer 26. In some embodiments, the buffer layer 24 may include a dielectric material such as silicon oxide (SiO) or silicon nitride (SiN), silicon oxy-nitride (SiON), or other dielectric material and may be formed by chemical vapor deposition (CVD), physical vapor deposition (PVD), or other suitable techniques. The buffer layer may be planarized by a chemical mechanical planarization (CMP) process to form a smooth surface.

The grid structure 30 resides above the buffer layer 24. Note, the grid structures of the embodiments are not limited to the metal and dielectric materials described. Other materials can be used as part of the dielectric grid to form a filter grid. The filter grid, for example, can use color filter material, polymers, or other materials instead of or in addition to the materials described above to form the filter grid or light guiding structure.

Figure 4:
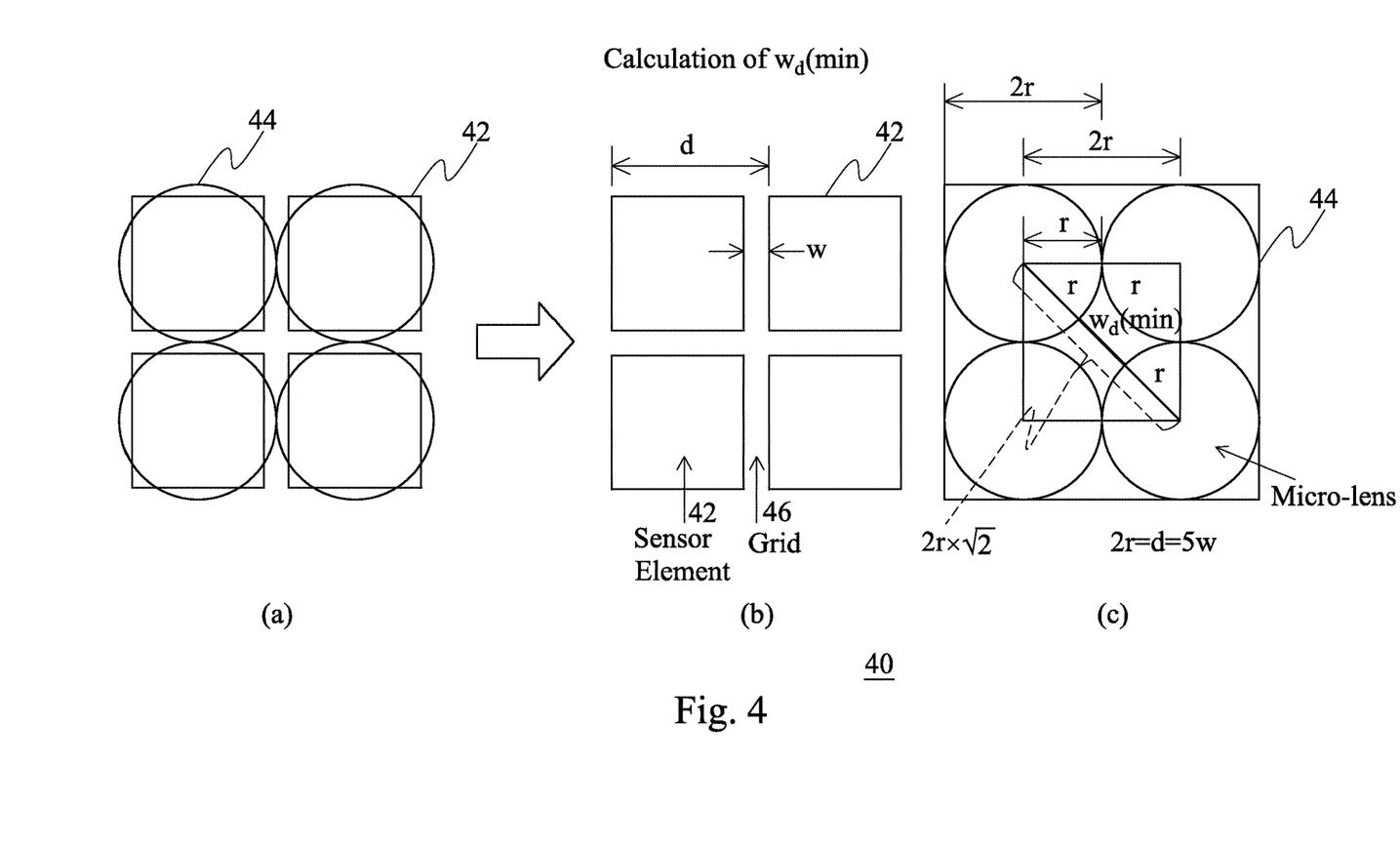
FIG. 4 is a top plan view of portions of an image sensor in accordance with the embodiments.

Referring to the representation of a top view of an image sensor 40 of FIG. 4(a-c), when using a sinking micro-lens 44, the shape of the micro-lens will become a circle (44) representing a photo sensor element underneath (see 28 of FIG. 2b). The distance between the photo sensor elements 42 is representative of the primary grid width "w" as shown in FIG. 4(b). As shown in FIG. 4(c), the minimum value $w_d$ (min) of the diagonal grid width $w_d$ in the diagonal direction is determined by the case when the micro-lenses are abutting each other. This minimum width $w_d$ (min) is given using the following formula:

$$w_d(\min) = 2r \times \sqrt{2} - 2r$$
$$= (\sqrt{2} - 1) \times 2r$$
$$= (\sqrt{2} - 1) \times d$$
$$= (0.414) \times Aw$$

where A is a variable that can range from approximately 4.5 to approximately 5. Thus, in some embodiments when A=4.5, then $$= (\sqrt{2} - 1) \times 4.5w$$
$$= 1.863w$$

where r is the radius and d is the diameter of the circles shown in FIG. 4(c). "d" is also the pitch of the grid. In some embodiments, the width w of the grid has a range from approximately 0.1 um to 1 um and the pitch d has a range from approximately 0.5 um to 5 um.

In some embodiments, the value of d is substituted with 4.5 w as an approximation when calculating the minimum diagonal width. Thus, a value of √3 w is chosen which is larger than √2 w. Remember, as explained above, that √2 w was the minimum diagonal width for a design with square corners. Again, the use of 2 r=d=4.5 w in the equations above is an approximation that is dependent on the design. Using 2 r=d=4.5 instead of 2 r=d=5 w presents a more extreme case since w is wider and causes more light loss due to blocking. These assumptions allow for a broader range of options in a design.

Figure 5:
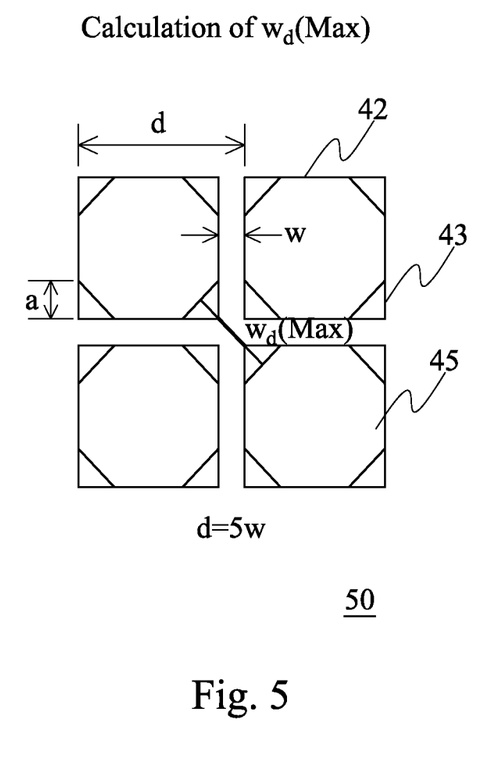
FIG. 5 is a top plan view of portions of an image sensor in accordance with the embodiments.

Referring to the representation of a top view of an image sensor 50 of FIG. 5, $w_d$(Max) can be determined by the case in which the unblocked area of the pixel becomes, in one example, 95% of the original area without the grid (that is, when 5% of the pixel area is covered by the grid lines and their intersections). It is undesirable for $w_d$ to be very large, since the area of the grid lines and intersections reduces the light-collecting portion of the pixel area and degrades the performance like SNR-10 or quantum efficiency. Thus, $w_d$(Max) can be determined or estimated using the following:

$$\frac{2a^2}{(4d/5)^2} = n \%$$

In one example, where n=5 as explained above representing 5% of the pixel area covered by the grid lines and their intersections, then:

$$\frac{2a^2}{(4d/5)^2} = 5\%$$

$$a^2 = \frac{4}{250}d^2$$

$$a = \frac{2}{5\sqrt{10}}d$$

$$w_d(\text{Max}) = \sqrt{2}\,w + \sqrt{2}\,a$$
$$= \sqrt{2}\,(w+a)$$
$$= \sqrt{2}\left(w + \frac{2}{\sqrt{10}}w\right)$$
$$= 2.31w$$

Where a is the length of the triangle segment 43 shown in FIG. 5

When determining the maximum diagonal grid width $w_d$, the value above is rounded up to the nearest integer number. Even when a particular design is close or approaches the assumption that 2 r=d=5 w, a proper lower limit for $w_d$ is desirable. The larger the upper limit, the more the grid structure blocks light. The calculations above assumes a 5% light loss to obtain 2.31 w, but in some embodiments other considerations besides light loss are considered that still ensure good image quality. Thus, the upper limit can be pushed up to the next higher integer number to 3 w for broader application considering other factors. Thus, in some embodiments, a value of 3 w is chosen for $w_d$(Max).

Further, as shown in FIG. 5, the grid structure can have an octagonal shape. More particularly, the grid structure can have openings 45 that form an octagonal shape. In some embodiments, the opening 45 can have at least 8 sides where some embodiments have more than 8 sides. In some embodiments, the edges of the openings 45 can be rounded grid openings as shown in the openings 32 of FIG. 3 and described above.

With the grid as described herein, there is no need to fine tune process conditions to shape the opening in grid structures (metal and/or dielectric grids). In order to prevent crosstalk from the light impinging on the color image sensor, the grid structure herein properly blocks such light from crossing between photo-sensing elements.

Using the design parameters described herein can prevent light from going through the intersection of neighboring pixels, thus preventing crosstalk. Thus, the rounded grid openings and grid intersections having the diagonal grid width $w_d$ (where $\sqrt{3}\,w \leq w_d \leq 3\,w$) between two adjacent photo sensor elements in the diagonal direction can block such unwanted signals.

Figure 6:
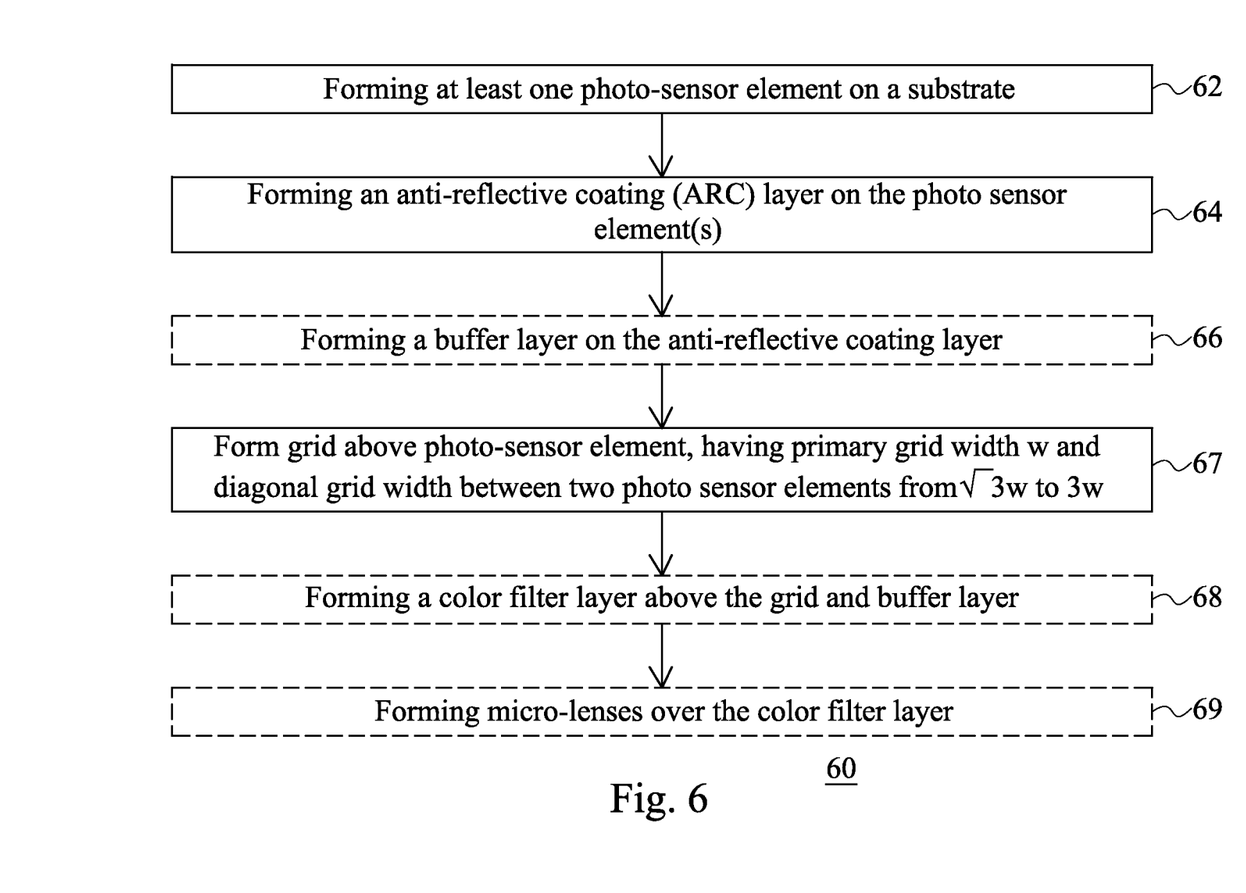
FIG. 6 is a flow chart illustrating a method of in accordance with an embodiment herein.

FIG. 6 illustrates a flow chart of a method 60 of fabricating a semiconductor device such as an image sensor including a light guide grid. The method includes forming at least one photo sensor element on a substrate at step 62. The image sensor is formed with a number of sensor elements or photo diode elements formed on the surface of the semiconductor substrate (e.g., a silicon substrate). An anti-reflective coating (ARC) layer is formed above the photo diode elements and the substrate at step 64. A buffer layer is then formed above the ARC layer at step 66. The buffer layer can comprise dielectric material, such as silicon oxide (SiO), silicon nitride (SiN), silicon oxy-nitride (SiON), or other dielectric material.

At step 67, a grid is formed above the ARC layer, the buffer layer, and the at least one photo-sensor element. Each line 31, 33 of the grid or grid structure has a primary grid width "w" and a diagonal grid width between two photo sensor elements in a diagonal direction ($w_d$) with a value between a minimum of approximately $\sqrt{3}$ w and a maximum of approximately 3 w. In some embodiments, the diagonal grid width can exceed 2 w. In some embodiments, the diagonal grid width can be equal to or less than 3 w. In other embodiments, the diagonal grid width can have a range between approximately 2 w and approximately 3 w. The grid optionally includes rounded corners. The grid can also optionally include intersecting lines formed of metallic material.

A color filter layer is provided over the grid and buffer layer at step 68. At step 69, a micro-lens is formed over the color filter layer. The micro-lens can be a sinking micro-lens and can include a convex shaped upper surface which causes parallel light rays to converge and strike the sensor below.

In some embodiments, a light guide grid can include a grid structure having a plurality of intersecting grid lines, each grid line having a width w, and a plurality of openings for photosensor elements between intersecting grid lines. The grid structure has a diagonal grid width $w_d$ between two adjacent ones of the plurality of openings in a diagonal direction. The diagonal grid width has a value exceeding approximately $\sqrt{3}$ w. In some embodiments, the diagonal grid width is greater than or equal to 2 w. In some embodiments, the diagonal grid width is less than or equal to 3 w. In some embodiments, the openings in the light guide grid has round corners. In some embodiments, the width w has a value in a range from approximately 0.1 um to 1 um. In another aspect, the light guide grid forms a portion of a color image sensor further having a sinking micro-lens and a color filter. In one arrangement, the light guide grid is arranged above a plurality of photo diodes on a substrate. In yet another arrangement, the light guide grid is arranged below a plurality of sinking micro-lenses and a plurality of color filters. In one arrangement, the grid structure has an octagonal shape. In another arrangement the light guide grid is made or metal or opaque dielectric materials.

In another embodiment, an image sensor includes a color filter, a micro-lens over the color filter, and a light guide grid. The light guide grid has a grid structure having a plurality of intersecting grid lines, each grid line having a width w, the grid structuring having at least one opening for a photosensor element between intersecting grid lines, the opening aligned with the microlens. The grid structure further has a diagonal grid width $w_d$ between adjacent ones of the plurality of openings in a diagonal direction exceeding approximately $\sqrt{3}$ w. In some embodiments, the diagonal grid width is greater than or equal to 2 w. In some embodiments the diagonal grid width is less than or equal to 3 w. In some embodiments, the diagonal grid width is in a range from approximately $\sqrt{3}$ w to approximately 3 w. In some embodiments, the width w has a value in a range from approximately 0.1 um to 1 um. In some embodiments, the opening has rounded corners. In some embodiments, at least one opening of the grid structure is octagonal in shape. In some embodiments, the light guide grid is made of metal or dielectric materials. In some embodiments, the light guide grid is made of metal having a thickness of approximately 50 nm to 500 nm. In one arrangement, the micro-lens is a sinking micro-lens. In some embodiments, the sinking micro-lens has a circular shape. In some arrangements, the color filter has a polygonal shape or a rectangular shape.

In yet another embodiment, a method of fabricating an image sensor with a light guide grid includes forming at least one photo-sensor element on a substrate and forming a grid above the at least one photo sensor element. The grid has a plurality of intersecting grid lines, each having a width w. The grid further has a diagonal grid width $w_d$ between two adjacent ones of the openings in a diagonal direction having a value exceeding $\sqrt{3}$ w. In some embodiments, forming the grid includes providing an opening having at least 8 sides and providing rounded corners of openings of the grid. In another embodiment, forming the grid includes forming the plurality of intersecting grid lines between a micro-lens and the at least one photo-sensor element on the substrate. In some embodiments, forming the grid includes forming the intersecting lines from a metallic material above a semiconductor substrate.

The preceding merely illustrates the principles of the disclosure. It will thus be appreciated that those skilled in the art will be able to devise various arrangements which, although not explicitly described or shown herein, embody the principles of the disclosure and are included within its spirit and scope. Embodiments can include, but are not limited to the design method of rounding corners in a light guiding grid, but can include other techniques within the parameters described herein that can reduce or block optical crosstalk as noted.

Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "to", "from", "lower," "upper," "horizontal," "vertical," "above," "below," "up," "down," "before", "after", "top" and "bottom" as well as derivatives thereof (e.g., "horizontally,", "vertically", "downwardly," "upwardly," etc.) should be construed to refer to the orientation as then described or as shown in the drawing under discussion. The drawings are arbitrarily oriented for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments, which can be made by those skilled in the art without departing from the scope and range of equivalents.

We claim:

1. A light guide grid, comprising:
a first grid structure having a plurality of intersecting first grid lines, each first grid line having a width w, and a plurality of first openings between the plurality of intersecting first grid lines; and
a second grid structure comprising a plurality of intersecting second grid lines disposed above a top surface of the intersecting first grid lines, the second grid structure further comprising a plurality of second openings between the plurality of intersecting second grid lines for a plurality of color filters placed between the intersecting first grid lines, wherein each of the color filters protrudes beyond a top surface of the intersecting second grid lines,
wherein each of the plurality of first openings are vertically offset from, have a different horizontal cross-sectional shape, and are larger than each of the second openings for the plurality of color filters, wherein each of the plurality of first openings is shaped to have straight side edges and rounded corners in which two side edges meet, the first grid structure having a diagonal grid width between two diagonally opposite rounded corners of two diagonally adjacent openings, and wherein the diagonal grid width is in the range of $\sqrt{3}$ w to 3 w.

2. The light guide grid of claim 1, wherein the width w has a value in a range from approximately 0.1 um to 1 um.

3. The light guide grid of claim 1, wherein the light guide grid is comprised of metal.

4. The light guide grid of claim 1, wherein the light guide grid is comprised of dielectric opaque materials.

5. The light guide grid of claim 1, wherein the diagonal grid width is greater than or equal to 2 w to reduce noise and crosstalk among photo sensor elements underneath.

6. The light guide grid of claim 1, wherein a lowest part of the second openings is higher than a lowest part of the first openings.

7. The light guide grid of claim 1, wherein the second openings comprise an octagonal horizontal cross-sectional shape.

8. An image sensor, comprising:
a plurality of color filters;
a plurality of micro-lenses over the plurality of color filters, wherein the plurality of micro-lenses are abutting each other and are circle-shaped, and wherein each of the plurality of circle-shaped micro-lenses extends downwardly beneath a top surface of the plurality of color filters; and
a light guide grid, comprising:
a first grid structure having a plurality of intersecting first grid lines, each first grid line having a width w, the first grid structure having a plurality of first openings placed between the plurality of intersecting first grid lines; and
a second grid structure comprising a plurality of intersecting second grid lines disposed above a top surface of the intersecting first grid lines, the second grid structure further comprising a plurality of second openings between the plurality of intersecting second grid lines for the plurality of color filters placed between the intersecting first grid lines, wherein each of the color filters protrudes beyond a top surface of the intersecting second grid lines, wherein each of the plurality of first openings are vertically offset from, have a different horizontal cross-sectional shape, and are larger than each of the second openings for the plurality of color filters, wherein each of the plurality of first openings is shaped to have straight side edges and rounded corners in which two side edges meet, the first grid structure having a diagonal grid width between two diagonally opposite rounded corners of two diagonally adjacent openings, and wherein the diagonal grid width is in the range of $\sqrt{3}$ w to 3 w.

9. The image sensor of claim 8, wherein the diagonal grid width is greater than or equal to 2 w to reduce noise and crosstalk among photo sensor elements underneath.

10. The image sensor of claim 8, wherein the width w has a value in a range from approximately 0.1 um to 1 um.

11. The image sensor of claim 8, wherein the light guide grid is comprised of metal having a thickness of approximately 50 nm to 500 nm.

12. The image sensor of claim 8, wherein the light guide grid is comprised of dielectric materials.

13. An image sensor, comprising:
a photo sensor element;
a plurality of color filters disposed over the photo sensor element;
a plurality of micro-lenses over the plurality of color filters, wherein the plurality of micro-lenses are abutting each other and are circle-shaped, and wherein each of the plurality of circle-shaped micro-lenses extends downwardly beneath a top surface of the plurality of color filters; and
a light guide grid, comprising:
a first grid structure having a plurality of intersecting first grid lines, each first grid line having a width w, the first grid structure having a plurality of first openings placed between and the plurality of intersecting first grid lines; and
a second grid structure comprising a plurality of intersecting second grid lines disposed above a top surface of the intersecting first grid lines, the second grid structure further comprising a plurality of second openings between the plurality of intersecting second grid lines for the plurality of color filters placed between the intersecting first grid lines, wherein each of the color filters protrudes beyond a top surface of the intersecting second grid lines, wherein each of the plurality of first openings are vertically offset from, have a different horizontal cross-sectional shape, and are larger than each of the second openings for the plurality of color filters, wherein each of the plurality of first openings is shaped to have straight side edges and rounded corners in which two side edges meet, the first grid structure having a diagonal grid width between two diagonally opposite rounded corners of two diagonally adjacent openings, and wherein the diagonal grid width is in the range of $\sqrt{3}$ w to 3 w.

14. The image sensor of claim 13, wherein the diagonal grid width is greater than or equal to 2 w.

15. The image sensor of claim 13, wherein the width w has a value in a range from approximately 0.1 um to 1 um.

16. The image sensor of claim 13, wherein the light guide grid is comprised of metal having a thickness of approximately 50 nm to 500 nm.

17. The image sensor of claim 13, wherein the light guide grid is comprised of dielectric materials.

18. The image sensor of claim 13, further comprising an anti-reflective coating (ARC) layer disposed between the photo sensor element and the color filter.

19. The image sensor of claim 13, further comprising a buffer layer disposed between the photo sensor element and the plurality of color filters.

20. The image sensor of claim 13, wherein the second openings are polygonal.

* * * * *